(12) United States Patent
Shi et al.

(10) Patent No.: US 12,201,007 B2
(45) Date of Patent: Jan. 14, 2025

(54) DISPLAY DEVICE

(71) Applicant: BOE Technology Group Co., Ltd., Beijing (CN)

(72) Inventors: Boyang Shi, Beijing (CN); Yue Cui, Beijing (CN); Yuehan Wei, Beijing (CN); Hong Zhu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 92 days.

(21) Appl. No.: 17/768,863

(22) PCT Filed: Jul. 7, 2021

(86) PCT No.: PCT/CN2021/104909
§ 371 (c)(1),
(2) Date: Apr. 14, 2022

(87) PCT Pub. No.: WO2022/042058
PCT Pub. Date: Mar. 3, 2022

(65) Prior Publication Data
US 2024/0099118 A1    Mar. 21, 2024

(30) Foreign Application Priority Data
Aug. 24, 2020    (CN) .......................... 202010858480.0

(51) Int. Cl.
*H01L 29/08*    (2006.01)
*H10K 77/10*    (2023.01)
*H10K 102/00*    (2023.01)

(52) U.S. Cl.
CPC ...... *H10K 77/111* (2023.02); *H10K 2102/311* (2023.02)

(58) Field of Classification Search
CPC ............ H10K 2102/311; H10K 77/111; G02F 1/133308; G02F 1/133603; G02F 2201/46;
(Continued)

(56) References Cited

U.S. PATENT DOCUMENTS

2017/0310799 A1*  10/2017  Lin ..................... H04M 1/0268
2019/0107750 A1    4/2019  Chen
(Continued)

FOREIGN PATENT DOCUMENTS

CN    104980545 A    10/2015
CN    106773346 A    5/2017
(Continued)

OTHER PUBLICATIONS

International Search Report for PCT/CN2021/104909 Mailed Oct. 9, 2021.
(Continued)

*Primary Examiner* — Niki H Nguyen
(74) *Attorney, Agent, or Firm* — Ling Wu; Stephen Yang; Ling and Yang Intellectual Property

(57) ABSTRACT

A display device, comprising: a flexible display module (4), a fixing frame (11) and a bending frame (12). The flexible display module comprises a first planar region (41), a second planar region (43), and a first bending region (42) between the first planar region and the second planar region. The fixing frame comprises a first frame (111) for fixing the first planar region and a second frame (112) for fixing the second planar region. The bending frame comprises a first deformation frame (31), a first bending frame (121), a second deformation frame (32), a second bending frame (122), and a bending mechanism (123) between the first bending frame and the second bending frame, the first bending frame being fixed to the first frame by means of first deformation frame,
(Continued)

second bending frame being fixed to the second frame by means of second deformation frame.

15 Claims, 9 Drawing Sheets

(58) Field of Classification Search
CPC ...... H05K 1/147; H05K 3/361; H05K 5/0226; H05K 5/0017; H05K 5/0204; H05K 5/03; H05K 7/1427; H05K 1/028; H05K 1/189
See application file for complete search history.

(56) References Cited

U.S. PATENT DOCUMENTS

| | | | |
|---|---|---|---|
| 2020/0051881 A1* | 2/2020 | Park | B32B 3/04 |
| 2020/0058899 A1 | 2/2020 | Bu et al. | |
| 2020/0178403 A1 | 6/2020 | Zhai | |
| 2022/0019266 A1 | 1/2022 | Park et al. | |

FOREIGN PATENT DOCUMENTS

| | | | | |
|---|---|---|---|---|
| CN | 108034373 A | | 5/2018 | |
| CN | 108831301 A | | 11/2018 | |
| CN | 209330168 U | | 8/2019 | |
| CN | 110718152 A | | 1/2020 | |
| CN | 110827680 A | | 2/2020 | |
| CN | 210627728 U | | 5/2020 | |
| CN | 111263541 A | | 6/2020 | |
| CN | 111951683 A | | 11/2020 | |
| CN | 112002228 A | * 11/2020 | ........... G06F 1/1652 |
| CN | 110265438 B | * 6/2021 | ............ G09F 9/301 |
| IN | 108510890 A | | 9/2018 | |
| JP | 2007-279355 A | | 10/2007 | |
| JP | 2012-64665 A | | 3/2012 | |
| KR | 10-2016-0001622 A | | 1/2016 | |
| KR | 10-2020-0062827 A | | 6/2020 | |

OTHER PUBLICATIONS

Office Action dated Sep. 30, 2021 for Chinese Patent Application No. 202010858480.0 and English Translation.

* cited by examiner

DISPLAY DEVICE

CROSS-REFERENCE TO RELATED APPLICATIONS

The present application is a U.S. National Phase Entry of International Application No. PCT/CN2021/104909 having an international filing date of Jul. 7, 2021, which claims priority to Chinese Patent Application No. 202010858480.0, filed to the CNIPA on Aug. 24, 2020 and entitled "Display Device". The above-identified applications are incorporated into the present disclosure by reference in their entirety.

TECHNICAL FIELD

Embodiments of the present disclosure relate, but are not limited, to the field of display technology, and in particular to a display device.

BACKGROUND

Organic Light Emitting Display (OLED) has gradually become the first choice of screens, and has many advantages, such as self-illumination, short response time and high definition and contrast, and can also ensure the flexibility and adaptability of the screens. With the development of flexible display screens, people have higher and higher expectations of foldable display products.

SUMMARY

The following is a summary for subject matters described herein in detail. The summary is not intended to limit the scope of protection of claims.

An exemplary embodiment of the present disclosure provides a display device including: a flexible display module, a fixing frame and a bending frame.

The flexible display module includes a first plane region, a second plane region and a first bending region located between the first plane region and the second plane region. The fixing frame includes a first frame for fixing the first plane region and a second frame for fixing the second plane region.

The bending frame includes a first deformation frame, a first bending frame, a second deformation frame, a second bending frame, and a bending mechanism disposed between the first bending frame and the second bending frame, wherein the first bending frame is fixed with the first frame through the first deformation frame, and the second bending frame is fixed with the second frame through the second deformation frame.

In an exemplary embodiment of the present disclosure, the first bending frame includes a first rear frame connected with the first deformation frame; the second bending frame includes a second rear frame connected with the second deformation frame.

Alternatively, the first bending frame includes a first middle frame connected with the first deformation frame and a first rear frame connected with the first middle frame; the second bending frame includes a second middle frame connected with the second deformation frame and a second rear frame connected with the second middle frame.

In an exemplary embodiment of the present disclosure, the first middle frame is connected with the first rear frame through a third deformation frame, and the second middle frame is connected with the second rear frame through a fourth deformation frame.

In an exemplary embodiment of the present disclosure, the first deformation frame, the second deformation frame, the third deformation frame and the fourth deformation frame include a soft material.

In an exemplary embodiment of the present disclosure, the soft material includes any one or more of the following: ethylene propylene diene monomer (EPDM), thermoplastic polyester elastomer (TPEE) and rubber.

In an exemplary embodiment of the present disclosure, thicknesses of the first deformation frame, the second deformation frame, the third deformation frame, and the fourth deformation frame range from 200 μm to 300 μm.

In an exemplary embodiment of the present disclosure, a manner in which the first frame fixes the first plane region includes an adhesive fixing manner, a snap-fit fixing manner or a mechanical fixing manner; and a manner in which the second frame fixes the second plane region includes an adhesive fixing manner, a snap-fit fixing manner or a mechanical fixing manner.

In an exemplary embodiment of the present disclosure, the fixing frame further includes a support plate configured to support the flexible display module; and the support plate is fixedly connected with a side of the flexible display module away from a display side; and the support plate is also fixedly connected with the first frame and the second frame.

In an exemplary embodiment of the present disclosure, the support plate includes a first support surface, a second support surface, and a second bending region located between the first support surface and the second support surface; the first support surface is fixedly connected with a side of the first plane region away from the display side; the second support surface is fixedly connected with a side of the second plane region away from the display side; the second bending region is fixedly connected with a side of the first bending region away from the display side.

In an exemplary embodiment of the present disclosure, the bending mechanism includes a rotating shaft mechanism and a first flip plate and a second flip plate located on two sides of the rotating shaft mechanism, respectively; the first flip plate is disposed on a side of the first support surface away from the flexible display module, and the second flip plate is disposed on a side of the second support surface away from the flexible display module.

In an exemplary embodiment of the present disclosure, a side of the first flip plate adjacent to the support plate is fixedly connected with the first support surface; a side of the second flip plate adjacent to the support plate is fixedly connected with the second support surface.

In an exemplary embodiment of the present disclosure, the rotating shaft mechanism includes: a hinge structure and an appearance cover connected with the hinge structure; the first flip plate and the second flip plate are disposed on two sides of the hinge structure, respectively.

In an exemplary embodiment of the present disclosure, thicknesses of the fixing frame and the bending frame range from 1 mm to 5 mm.

In an exemplary embodiment of the present disclosure, a thickness of the fixing frame ranges from 1 mm to 5 mm, thicknesses of the first middle frame and the second middle frame range from 1 mm to 5 mm, and thicknesses of the first rear frame and the second rear frame range from 0.1 mm to 5 mm.

In an exemplary embodiment of the present disclosure, the first frame, the second frame, the first deformation frame, the second deformation frame, the first bending frame and the second bending frame are an integrated structure.

After the accompanying drawings and detailed descriptions are read and understood, other aspects may be understood.

BRIEF DESCRIPTION OF DRAWINGS

The accompanying drawings are used to provide an understanding to the technical solution of embodiments of the present disclosure, and form a part of the specification, and are used to explain, together with the embodiments of the present disclosure, technical solutions of the embodiments of the present disclosure, but do not form limitations to the technical solutions of the embodiments of the present disclosure.

DETAILED DESCRIPTION

Figure 1:
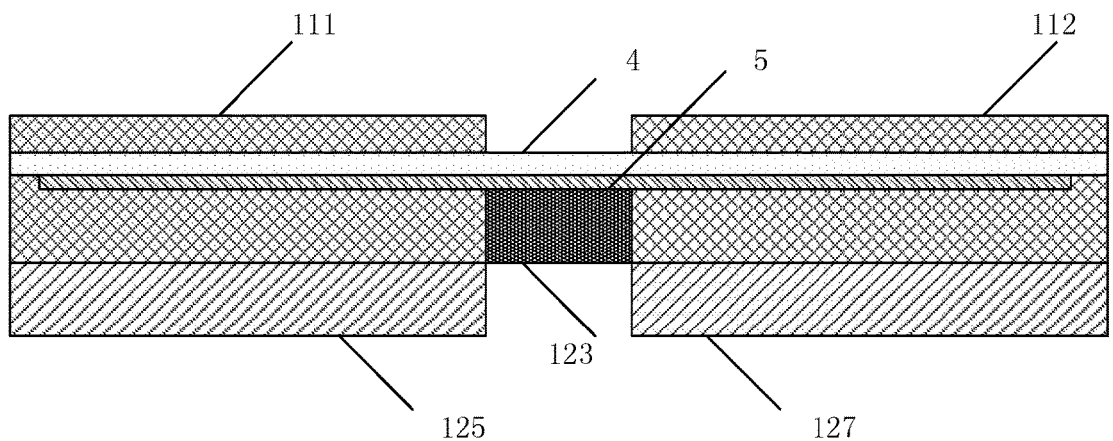
FIG. 1 is a schematic view of a structure of a foldable display device.

Unless otherwise defined, technical terms or scientific terms used in embodiments of the present disclosure should have the same meanings as commonly understood by a person skilled in the art to which the present disclosure pertains. "First", "second", and similar terms used in the embodiments of the present disclosure do not represent any order, number, or significance, but are only used to distinguish different components. "Comprise" or "include" or a similar term means that an element or object before the term covers the element or object and their equivalents listed after the term and does not exclude other elements or objects. Terms like "connection" or "coupling" are not limited to physical or mechanical connection, but may include electrical connection, whether direct or indirect. In addition, shapes, dimensions, scales, angles, numbers and the like shown in the drawings used to describe some exemplary embodiments of the present disclosure are only examples, and the embodiments of the present disclosure are not limited thereto.

FIG. 1 is a schematic view of a side view structure of a foldable display device. As shown in FIG. 1, in some foldable display devices, a flexible display module 4 is fixed on a housing frame, and a support plate 5 is provided on a side of the flexible display module 4 away from a display side, and is configured to support the flexible display module 4. The housing frame includes a first front frame 111, a second front frame 112, a first rear frame 125, a second rear frame 127 and a bending mechanism 123. When the foldable display device is folded, since the flexible display module and the support plate have different bending radii, a dislocation movement between the flexible display module and the support plate occurs. The dislocation movement between the flexible display module and the support plate causes edge of the housing frame and an end of the flexible display module to squeeze each other, which increases a failure risk of the flexible display module.

Figure 2:
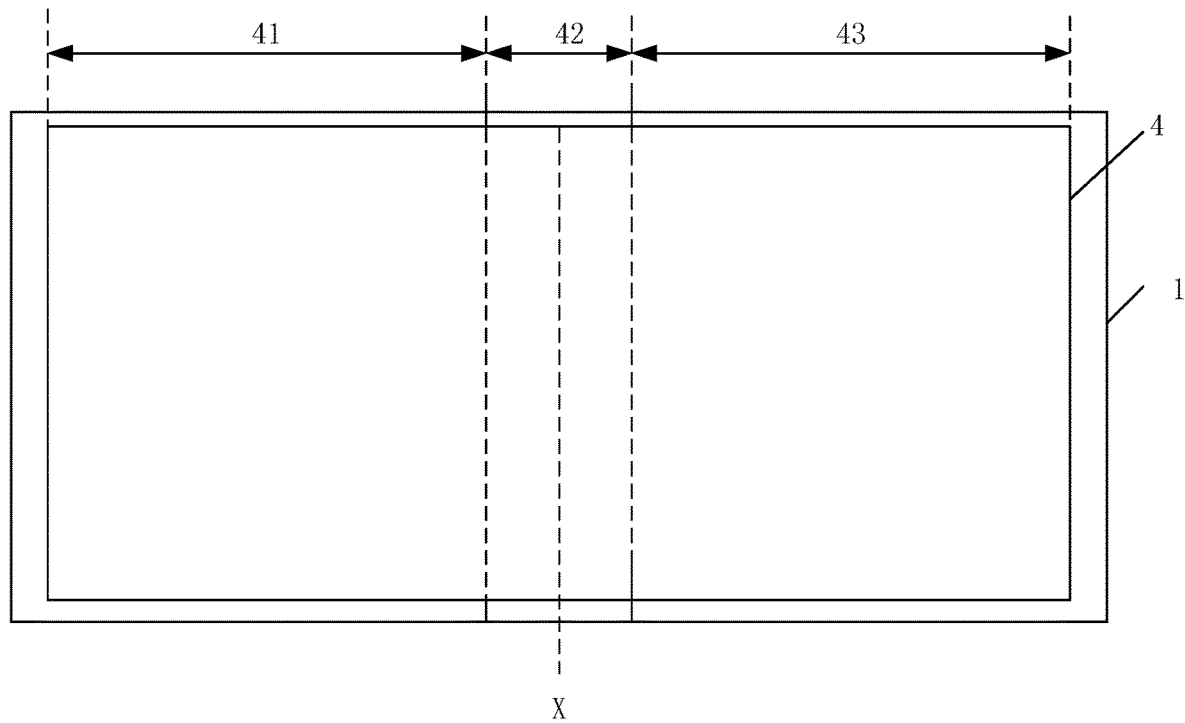
FIG. 2 is a plan view of a display device according to an exemplary embodiment of the present disclosure.
Figure 3:
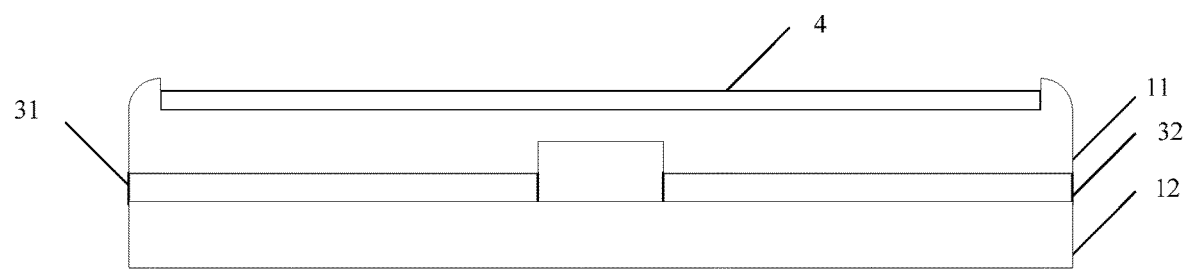
FIG. 3 is a side view of a display device provided by an embodiment of the present disclosure.

FIG. 2 is a plan view of a display device according to an exemplary embodiment of the present disclosure, and FIG. 3 is a side view of a display device according to an exemplary embodiment of the present disclosure. As shown in FIGS. 2 and 3, the display device includes a flexible display module 4 and a housing frame 1. The housing frame 1 includes a fixing frame 11 and a bending frame 12. The flexible display module 4 includes a first plane region 41, a second plane region 43, and a first bending region 42 located between the first plane region and the second plane region. The bending frame 12 fixes the fixing frame through a deformation frame 31 and a deformation frame 32.

Figure 4:
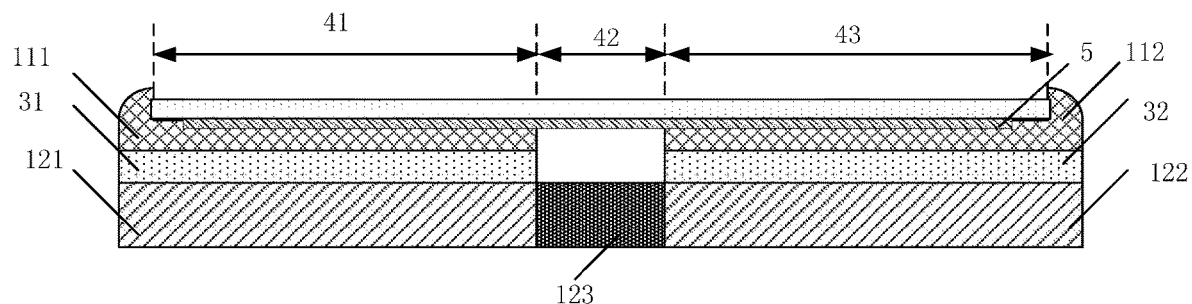
FIG. 4 is a cross-sectional view of the display device shown in FIG. 3.

FIG. 4 is a cross-sectional view of the display device shown in FIG. 3. As shown in FIG. 4, the flexible display module 4 includes the first plane region 41, the second plane region 43, and the first bending region 42 located between the first plane region and the second plane region. That is, in the flexible display module 4, region division may be performed according to whether a region is bendable or not. The bending region is a region where the flexible display module 4 is foldable with respect to a folding axis X and folded with a certain curvature radius when the flexible display module 4 is folded. The flexible display module 4 is maintained in a planarization state in the plane region which is a region extending to both sides of the bending region. That is, the plane region may be defined to have the bending region between the plane regions. When the flexible display module is folded, the plane regions on both sides of the bending region may be disposed opposite to each other. For example, as shown in FIG. 2, the bending region (the region 42 between the two dashed lines in FIG. 2) and the plane regions (the regions 41, 43 outside the two dashed lines in FIG. 2). Although FIG. 2 shows that the folding axis X is provided on a central axis of the flexible display module 4, the position of the folding axis X may be changed to any position within the first bending region 42.

As shown in FIG. 4, the fixing frame 11 includes a first frame 111 configured for fixing the first plane region 41, and a second frame 112 configured for fixing the second plane region 43. The fixing frame 11 further includes a support plate 5 which supports the flexible display module 4, and the support plate 5 is fixedly connected with a side of the flexible display module 4 away from the display side. The support plate 5 is also fixedly connected with the first frame 111 and the second frame 112.

In some exemplary embodiments, the support plate 5 includes a first support region, a second support region and a second bending region located between the first support region and the second support region. That is, in the support plate 5, region division may be performed according to whether a region is bendable or not. The second bending region is a region where the support plate 5 is foldable with respect to the folding axis X and folded with a certain radius of curvature when the support plate 5 is folded. The support plate 5 is maintained in the planarization state in the plane region which is a region extending to both sides of the bending region. That is, the plane region may be defined to have the bending region between the plane regions. When the support plate is folded, the plane regions on both sides of the bending region may be disposed opposite to each other. A first support surface is fixedly connected with a side of the first plane region away from the display side. A second support surface is fixedly connected with a side of the second plane region away from the display side. The second bending region is fixedly connected with a side of the first bending region away from the display side.

In an exemplary embodiment, the support plate may be fixedly connected to the fixing frame. For example, one end of the support plate is fixedly connected to the first frame 111, and the other end of the support plate is fixedly connected to the second frame 112.

In an exemplary embodiment, the fixing connection may use adhesive fixing, snap-fit fixing, or mechanical fixing, or other manners.

In some exemplary embodiments, the support plate 5 may be a metal support plate.

In some exemplary embodiments, an end of the first frame 111 is provided with a first groove configured for fixing one end of the flexible display module and a second groove configured for fixing one end of the support plate. An end of the second frame 112 is provided with a third groove configured for fixing the other end of the flexible display module and a fourth groove configured for fixing the other end of the support plate.

As shown in FIG. 4, the bending frame 12 includes a first bending frame 121 for fixing the first frame 111 through the first deformation frame 31, a second bending frame 122 for fixing the second frame 112 through the second deformation frame 32, and a bending mechanism 123 disposed between the first bending frame 121 and the second bending frame 122. That is, the first bending frame 121 and the second bending frame 122 are disposed opposite to each other on two sides of the bending mechanism 123 which corresponds to the first bending region 42. The first bending frame 121 and the second bending frame 122 may relatively rotate through the bending mechanism 123 so that the display device may be switched between a folded state and an unfolded state. When the display device is in the folded state, the bending mechanism 1233 is in a bent shape, and the first bending region 42 of the flexible display module 4 is in a bent shape. When the display device is in the unfolded state, the bending mechanism 123 is in the planarization state and the first bending region 42 of the flexible display module 4 is in the planarization state.

In some exemplary embodiments, the first deformation frame 31 and the second deformation frame 32 include a soft material. The soft material may use a material with small elastic modulus, such as ethylene propylene diene monomer (EPDM) and thermoplastic polyester elastomer (TPEE), so as to reduce an acting force between an end of the flexible display module and an edge of the housing frame when the display device is folded. The soft material may also use a mechanically anisotropic material such as rubber (for example, asbestos rubber or silicone rubber), and on the premise of ensuring a sufficiently small tangential elastic modulus, the elastic modulus in the normal direction should not be too small to avoid affecting the sense of touch of the display device.

In some exemplary embodiments, thicknesses of the first deformation frame and the second deformation frame may meet a preset thickness, so as to facilitate counteracting or reducing a squeezing force between the flexible display module and the housing frame when the display device is folded inward, or to facilitate counteracting or reducing a stretching force between the flexible display module and the housing frame when the display device is folded outward. For example, the thicknesses of the first deformation frame and the second deformation frame range from 200 μm (microns) to 300 μm.

In some exemplary embodiments, the thicknesses of the first frame 111, the second frame 112, the first bending frame 121, and the second bending frame 122 may each range from 1 mm (millimetre) to 5 mm.

Figure 5:
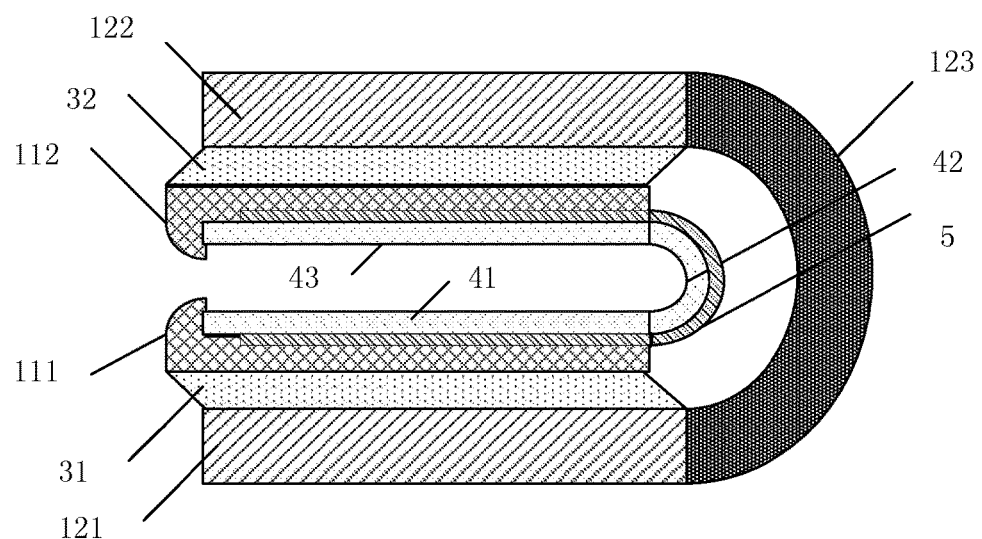
FIG. 5 is a schematic view of the display device shown in FIG. 4 when folded inward.

In some exemplary embodiments, based on the structure of the display device as shown in FIG. 4, when the display device is folded inward, as shown in FIG. 5, the first bending region 42 of the flexible display module 4 and the second bending region of the support plate 5 are bent inward and the bending mechanism 123 is turned inward. Since the bending radii of the first bending region 42 and the second bending region of the support plate 5 are different, and two ends of the flexible display module 4 and two ends of the support plate 5 are fixedly connected with the first frame 111 and the second frame 112, respectively, the first deformation frame 31 and the second deformation frame 32 are elastically deformed, so that the dislocation movement occurs between the first frame 111 and the first bending frame 121 and between the second frame 112 and the second bending frame 122, thereby compensating the dislocation movement between the end of the flexible display module 4 and the end of the support plate 5, reducing the squeeze between the end of the flexible display module and the edge of the housing frame, and avoiding the failure risk caused by the squeeze. Therefore, an interference from the end of the housing frame and the end of the flexible display module is avoided as compared to the solution of reserving some space at the end of the housing frame and the end of a flexible cover plate to solve the failure risk caused by the squeeze.

Figure 6:
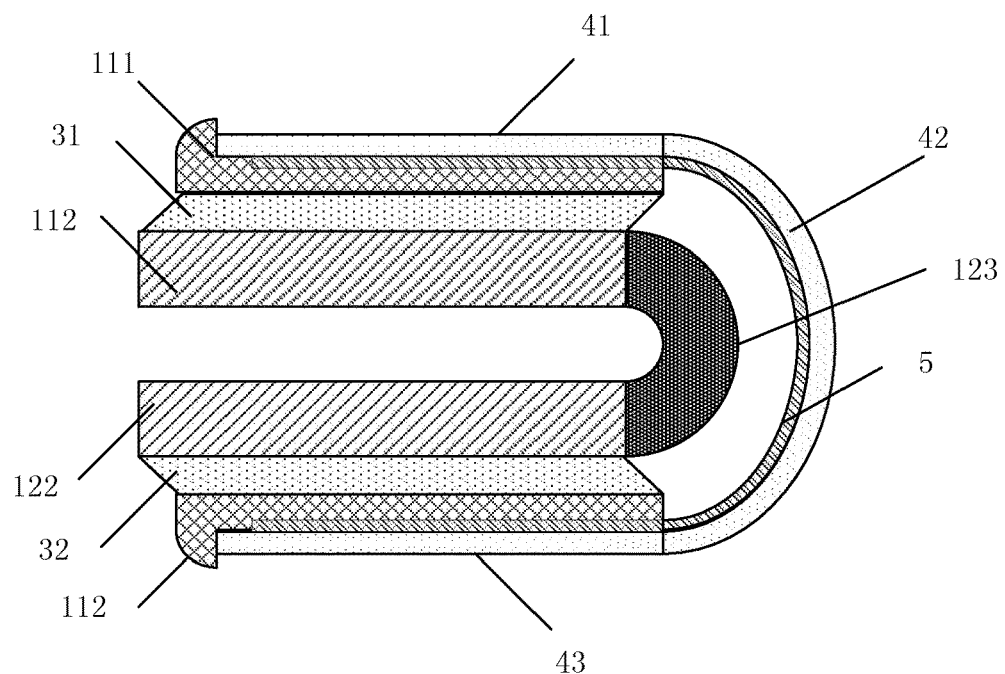
FIG. 6 is a schematic view of the display device shown in FIG. 4 when folded outward.

In some exemplary embodiments, based on the structure of the display device as shown in FIG. 4, when the display device is folded outward, as shown in FIG. 6, the first bending region 42 of the flexible display module 4 and the second bending region of the support plate 5 are bent outward and the bending mechanism 123 is turned outward. Since the bending radii of the first bending region 42 and the second bending region of the support plate 5 are different, and two ends of the flexible display module 4 and two ends of the support plate 5 are fixedly connected with the first frame 111 and the second frame 112, respectively, the first deformation frame 31 and the second deformation frame 32 are elastically deformed, so that the dislocation movement occurs between the first frame 111 and the first bending frame 121 and between the second frame 112 and the second bending frame 122, thereby compensating the dislocation movement between the end of the flexible display module 4 and the end of the support plate 5, reducing the squeeze between the end of the flexible display module and the edge of the housing frame, and avoiding the failure risk caused by the squeeze. Therefore, a gap at the end of the flexible display module and at the end of the edge of the housing frame is avoided as compared to the solution of reserving some space at the end of the housing frame and the end of the flexible cover plate to solve the failure risk caused by the squeeze.

In an exemplary embodiment of the present disclosure, based on the structure of the display device as shown in FIG. 4, the first bending frame 121 serving as a first rear frame is connected to the first deformation frame 31. The second bending frame 122 serving as a second rear frame is connected to the second deformation frame 32.

Figure 7:
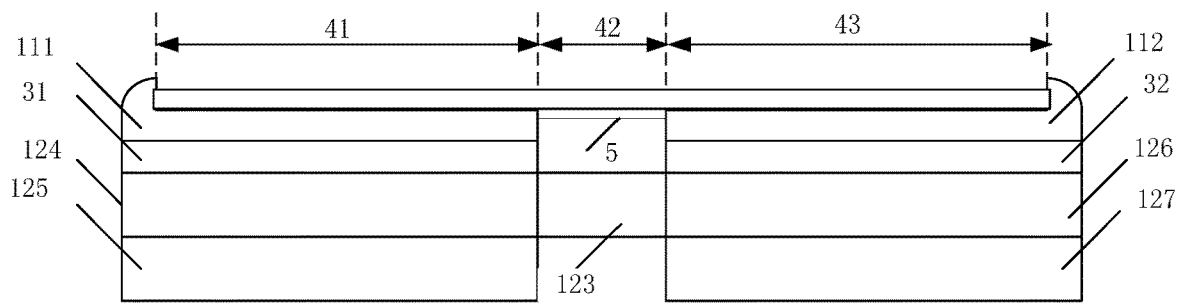
FIG. 7 is a side view of another display device according to an exemplary embodiment of the present disclosure.
Figure 8:
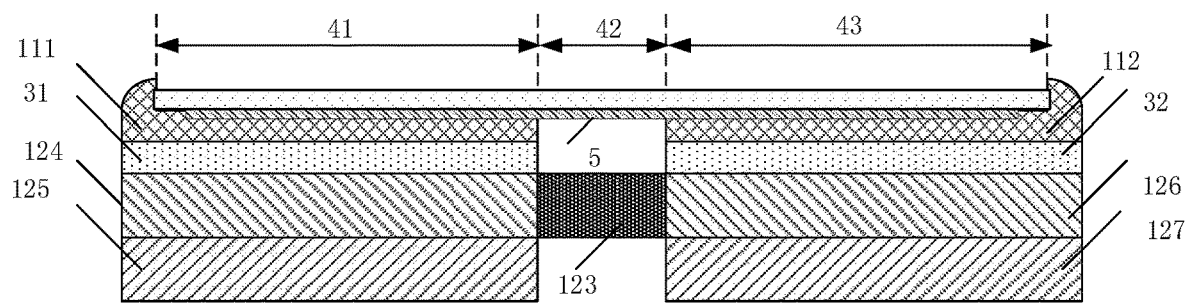
FIG. 8 is a cross-sectional view of the display device shown in FIG. 7.

In an exemplary embodiment of the present disclosure, FIG. 7 is a side view of another display device according to an exemplary embodiment of the present disclosure, and FIG. 8 is a cross-sectional view of the display device shown in FIG. 7. Compared with the display devices shown in FIGS. 3 and 4, the differences are that: the first bending frame 121 includes a first middle frame 124 connected to the first deformation frame 31 and a first rear frame 125 connected to the first middle frame 124; the second bending frame 122 includes a second middle frame 126 connected to the second deformation frame 32 and a second rear frame 127 connected to the second middle frame 126; the bending mechanism 123 is disposed between the first middle frame 124 and the second middle frame 126.

In some exemplary embodiments, the first middle frame 124 may be fixedly connected with the first rear frame 125, and the second middle frame 126 may be fixedly connected with the second rear frame 127.

In some exemplary embodiments, thicknesses of the first frame 111 and the second frame 112 may range from 1 mm to 5 mm, e.g., 2 mm. The thicknesses of the first middle frame 123 and the second middle frame 125 may range from 1 mm to 5 mm, e.g., 1.5 mm. The thicknesses of the first rear frame and the second rear frame may range from 0.1 mm to 5 mm, e.g., 0.5 mm.

Figure 9:
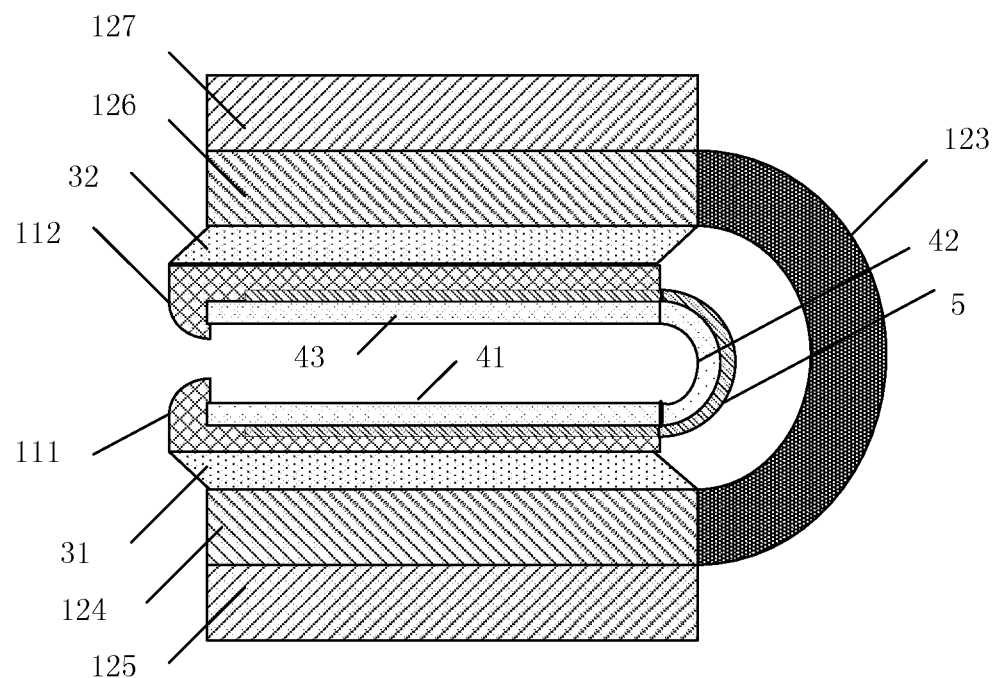
FIG. 9 is a schematic view of the display device shown in FIG. 8 when folded inward.

In some exemplary embodiments, based on the structure of the display device as shown in FIG. 8, when the display device is folded inward, as shown in FIG. 9, the first bending region 42 of the flexible display module 4 and the second bending region of the support plate 5 are bent inward and the bending mechanism 123 is turned inward. Since the bending radii of the first bending region 42 and the second bending region of the support plate 5 are different and two ends of the flexible display module 4 and two ends of the support plate 5 are fixedly connected with the first frame 111 and the second frame 112, respectively, the first deformation frame 31 and the second deformation frame 32 are elastically deformed, so that the dislocation movement occurs between the first frame 111 and the first bending frame 121 and between the second frame 112 and the second bending frame 122, thereby compensating the dislocation movement between the end of the flexible display module 4 and the end of the support plate 5, reducing the squeeze between the end of the flexible display module and the edge of the housing frame, and avoiding the failure risk caused by the squeeze. Therefore, the interference from the end of the housing frame and the end of the flexible display module is avoided as compared to the solution of reserving some space at the end of the housing frame and the end of the flexible cover plate to solve the failure risk caused by the squeeze.

Figure 10:
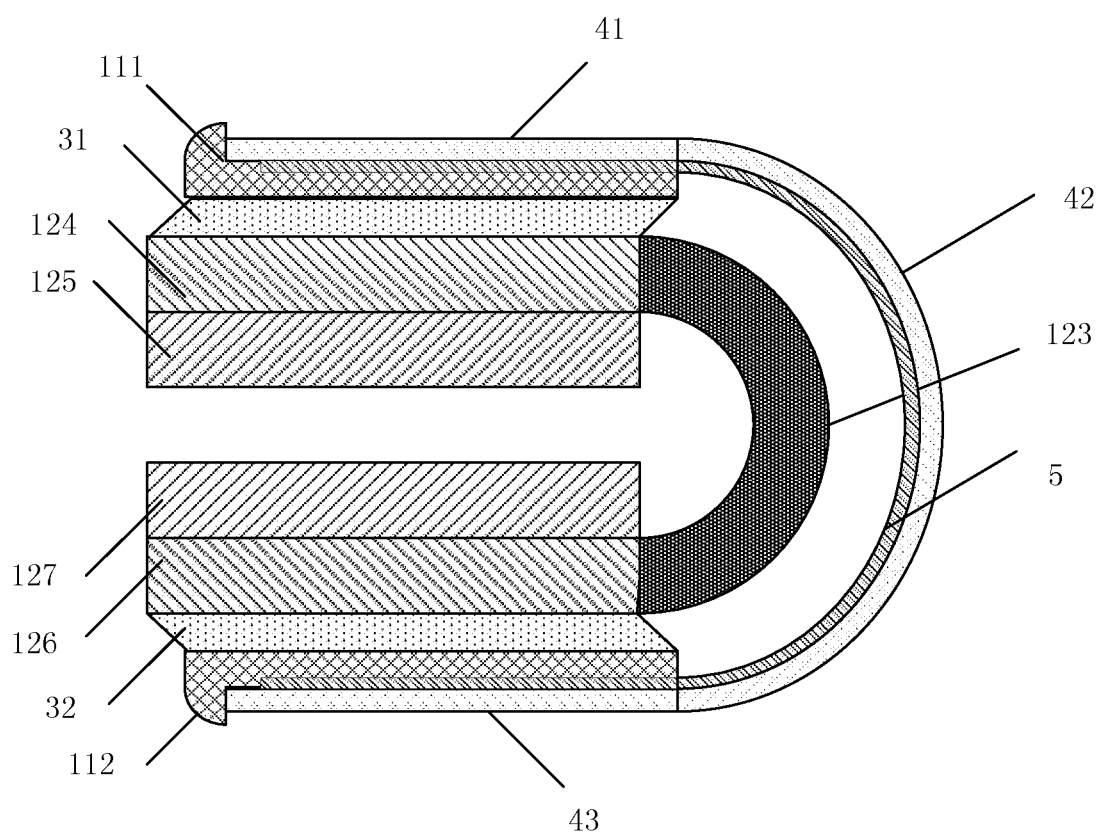
FIG. 10 is a schematic view of the display device shown in FIG. 8 when folded outward.

In some exemplary embodiments, based on the structure of the display device shown in FIG. 7, when the display device is folded outward, as shown in FIG. 10, the first bending region 42 of the flexible display module 4 and the second bending region of the support plate 5 are bent outward and the bending mechanism 123 is turned outward. Since the bending radii of the first bending region 42 and the second bending region of the support plate 5 are different, and two ends of the flexible display module 4 and two ends of the support plate 5 are fixedly connected with the first frame 111 and the second frame 112, respectively, the first deformation frame 31 and the second deformation frame 32 are elastically deformed, such that the dislocation movement occurs between the first frame 111 and the first bending frame 121 and between the second frame 112 and the second bending frame 122, thereby compensating the dislocation movement between the end of the flexible display module 4 and the end of the support plate 5, reducing the squeeze between the end of the flexible display module and the edge of the housing frame, and avoiding the failure risk caused by the squeeze. Therefore, the gap at the end of the flexible display module and at the end of the edge of the housing frame is avoided as compared to the solution of reserving some space at the end of the housing frame and the end of the flexible cover plate to solve the failure risk caused by the squeeze.

Figure 11:
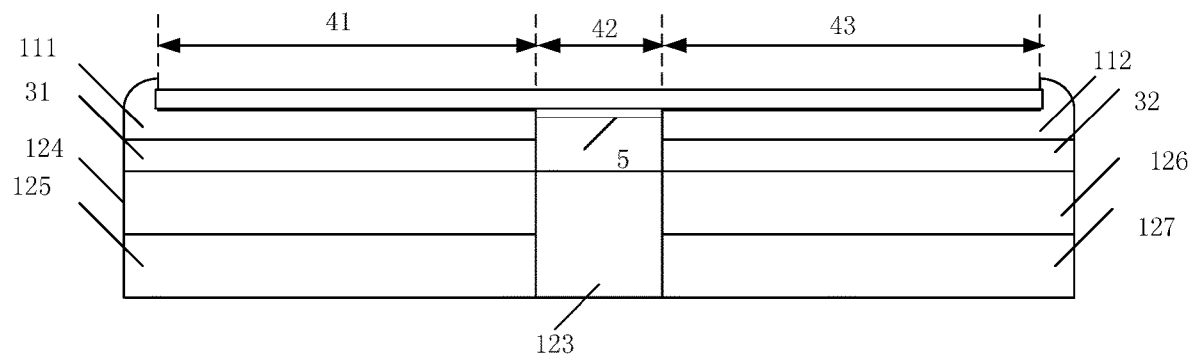
FIG. 11 is a side view of another display device according to an exemplary embodiment of the present disclosure.
Figure 12:
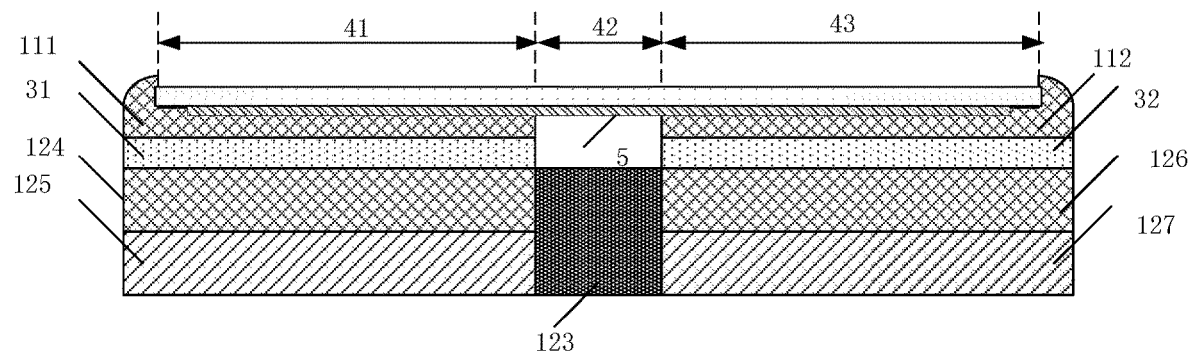
FIG. 12 is a cross-sectional view of the display device shown in FIG. 11.

In an exemplary embodiment of the present disclosure, FIG. 11 is a side view of another display device according to an exemplary embodiment of the present disclosure and FIG. 12 is a cross-sectional view of the display device shown in FIG. 11. Compared with the display devices shown in FIGS. 7 and 8, the differences are that: the bending mechanism 123 is disposed between the first middle frame 124, the first rear frame 125 and the second middle frame 126, the second rear frame 127.

Figure 13:
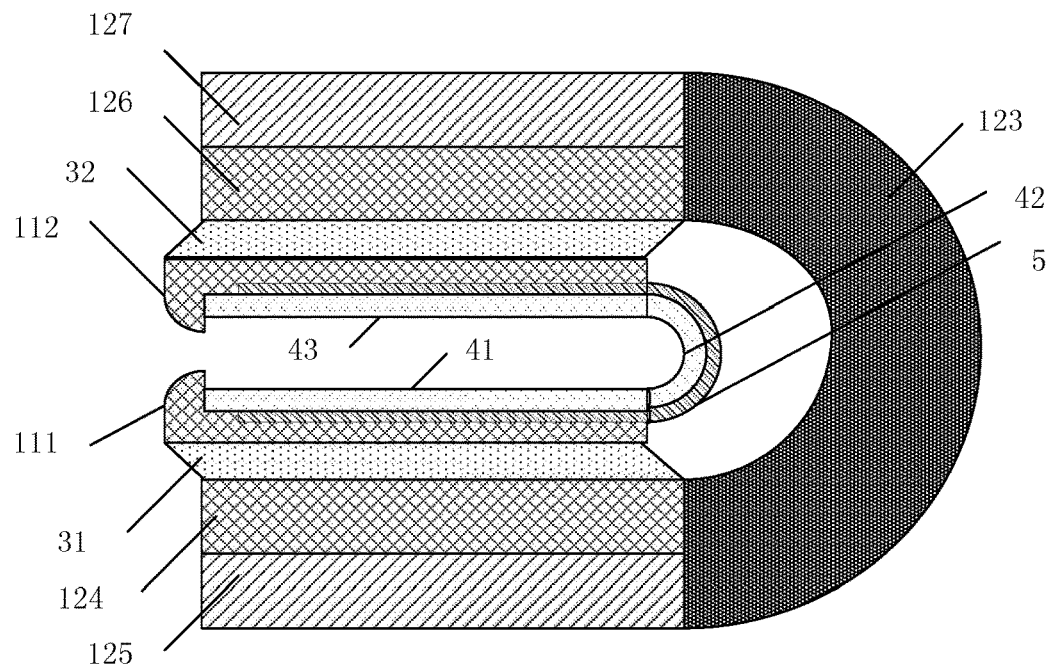
FIG. 13 is a schematic view of the display device shown in FIG. 12 when folded inward.

In some exemplary embodiments, based on the structure of the display device shown in FIG. 12, when the display device is folded inward, as shown in FIG. 13, the first bending region 42 of the flexible display module 4 and the second bending region of the support plate 5 are bent inward and the bending mechanism 123 is turned inward. Since the bending radii of the first bending region 42 and the second bending region of the support plate 5 are different, and two ends of the flexible display module 4 and two ends of the support plate 5 are fixedly connected with the first frame 111 and the second frame 112, respectively, the first deformation frame 31 and the second deformation frame 32 are elastically deformed, such that the dislocation movement occurs between the first frame 111 and the first bending frame 121 and between the second frame 112 and the second bending frame 122, thereby compensating the dislocation movement between the end of the flexible display module 4 and the end of the support plate 5, reducing the squeeze between the end of the flexible display module and the edge of the housing frame, and avoiding the failure risk caused the squeeze. Therefore, the interference from the end of the housing frame and the end of the flexible display module is avoided as compared to the solution of reserving some space at the end of the housing frame and the end of the flexible cover plate to solve the failure risk caused by the squeeze.

Figure 14:
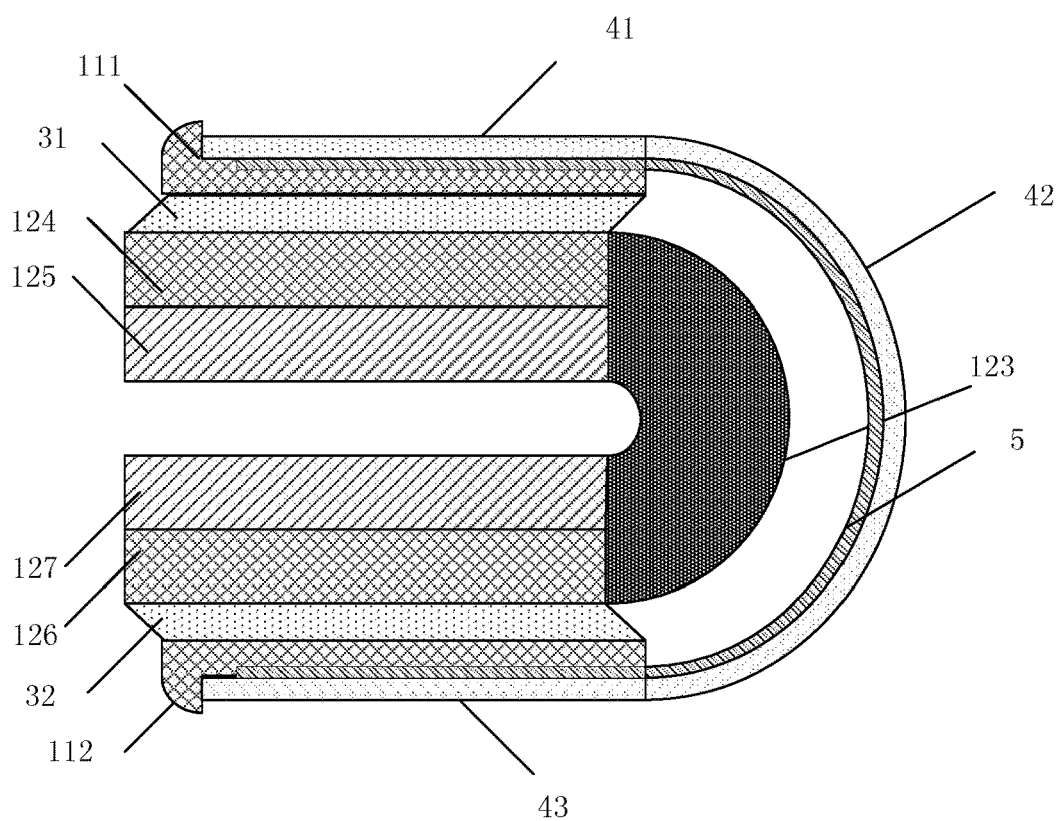
FIG. 14 is a schematic view of the display device shown in FIG. 12 when folded outward.

In some exemplary embodiments, based on the structure of the display device shown in FIG. 12, when the display device is folded outward, as shown in FIG. 14, the first bending region 42 of the flexible display module 4 and the second bending region of the support plate 5 are bent outward and the bending mechanism 123 is turned outward. Since the bending radii of the first bending region 42 and the second bending region of the support plate 5 are different, and two ends of the flexible display module 4 and two ends of the support plate 5 are fixedly connected with the first frame 111 and the second frame 112, respectively, the first deformation frame 31 and the second deformation frame 32 are elastically deformed, such that the dislocation movement occurs between the first frame 111 and the first bending frame 121 and between the second frame 112 and the second bending frame 122, thereby compensating the dislocation movement between the end of the flexible display module 4 and the end of the support plate 5, reducing the squeeze between the end of the flexible display module and the edge of the housing frame, and avoiding the failure risk caused by the squeeze. Therefore, the gap at the end of the flexible display module and at the end of the edge of the housing frame is avoided as compared to the solution of reserving some space at the end of the housing frame and the end of the flexible cover plate to solve the failure risk caused by the squeeze.

Figure 15:
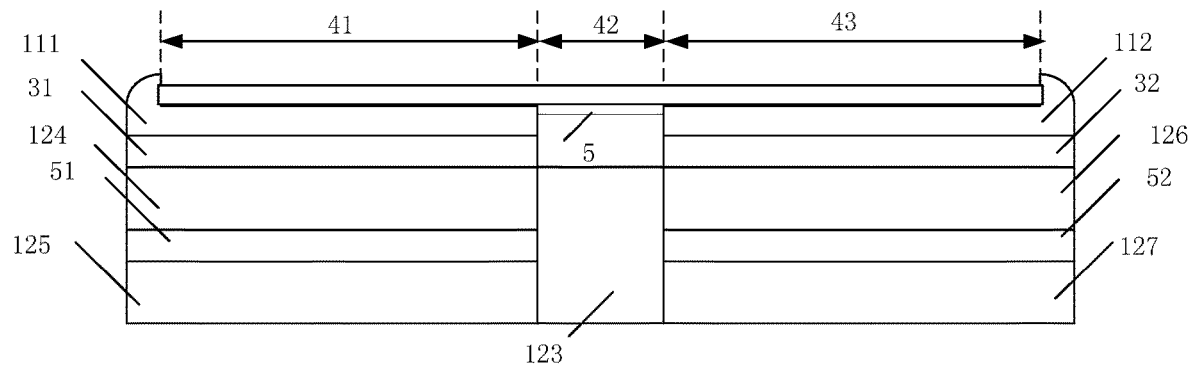
FIG. 15 is a side view of another display device according to an exemplary embodiment of the present disclosure.
Figure 16:
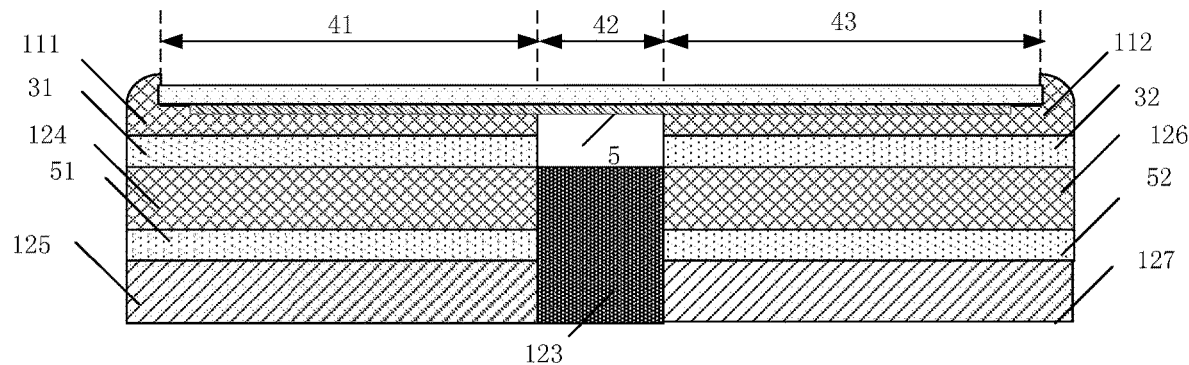
FIG. 16 is a cross-sectional view of the display device shown in FIG. 15.

In an exemplary embodiment of the present disclosure, FIG. 15 is a side view of another display device according to an exemplary embodiment of the present disclosure and FIG. 16 is a cross-sectional view of the display device shown in FIG. 15. Compared with the display devices shown in FIGS. 11 and 12, the differences are that: the first middle frame 124 and the first rear frame 125 are connected by a third deformation frame 51; the second middle frame 126 and the second rear frame 127 are connected by a fourth deformation frame 52.

In some exemplary embodiments, the third deformation frame 51 and the fourth deformation frame 52 include a soft material. The soft material may use a material with small elastic modulus, such as EPDM and/or TPEE, so as to reduce the acting force between the end of the flexible display module and the edge of the housing frame when being folded. The soft material may also use a mechanically anisotropic material such as rubber (such as asbestos rubber or silicone rubber), and on the premise of ensuring a sufficiently small tangential elastic modulus, the elastic modulus in the normal direction should not be too small to avoid affecting the sense of touch of the display device.

In some exemplary embodiments, the thicknesses of the third deformation frame and the fourth deformation frame may meet the preset thickness, so as to facilitate counteracting or reducing the squeezing force between the flexible display module and the housing frame when the display device is folded inward, or to facilitate counteracting or reducing the stretching force between the flexible display module and the housing frame when the display device is folded outward. For example, the thicknesses of the third deformation frame and the fourth deformation frame range from 200 μm to 300 μm.

Figure 17:
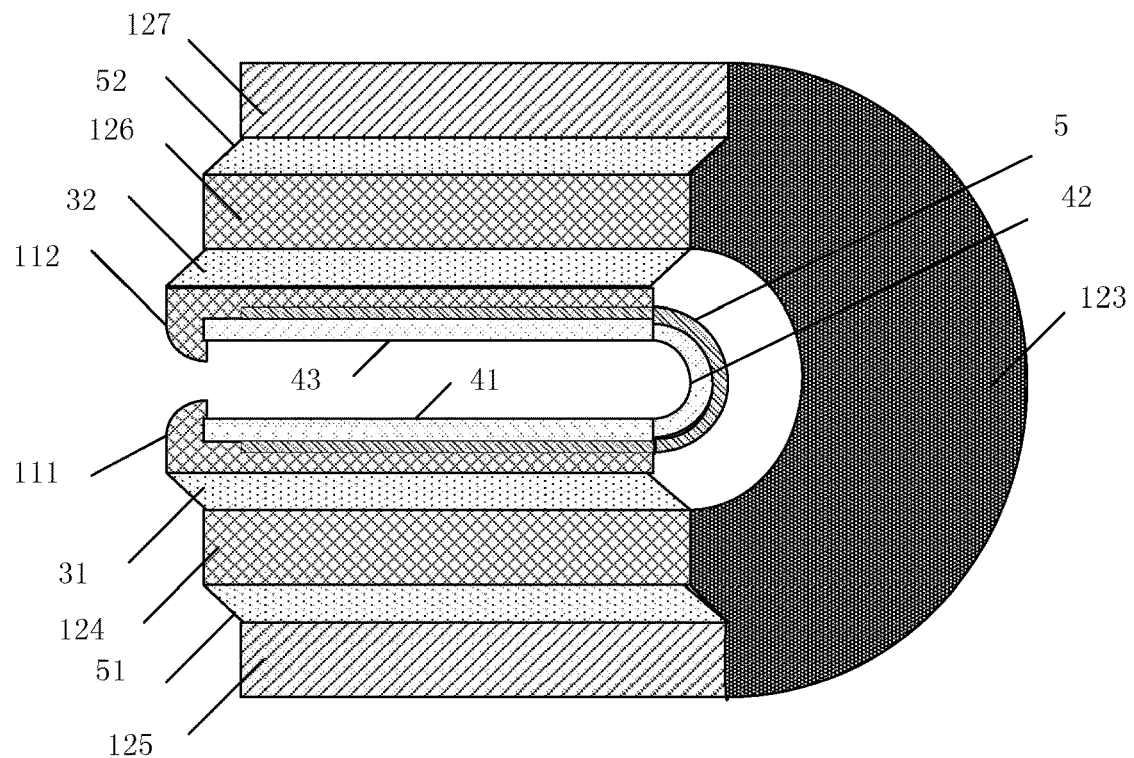
FIG. 17 is a schematic view of the display device shown in FIG. 16 when folded inward.

In some exemplary embodiments, based on the structure of the display device shown in FIG. 16, when the display device is folded inward, as shown in FIG. 17, the first bending region 42 of the flexible display module 4 and the second bending region of the support plate 5 are bent inward and the bending mechanism 123 is turned inward. Since the bending radii of the first bending region 42 and the second bending region of the support plate 5 are different, and two ends of the flexible display module 4 and two ends of the support plate 5 are fixedly connected with the first frame 111 and the second frame 112, respectively, the first deformation frame 31, the second deformation frame 32, the third deformation frame 51 and the fourth deformation frame 52 are elastically deformed, such that the dislocation movement occurs between the first frame 111 and the first middle frame 124 and between the second frame 112 and the second middle frame 126, and the dislocation movement also occurs between the first middle frame 124 and the first rear frame 125 and between the second middle frame 126 and the second rear frame 127, thereby compensating the dislocation movement between the end of the flexible display module 4 and the end of the support plate 5, reducing the squeeze between the end of the flexible display module and the edge of the housing frame, and avoiding the failure risk caused by the squeeze. Therefore, an interference from the end of the housing frame and the end of the flexible display module is avoided as compared to the solution of reserving some space at the end of the housing frame and the end of the flexible cover plate to solve the failure risk caused by the squeeze.

Figure 18:
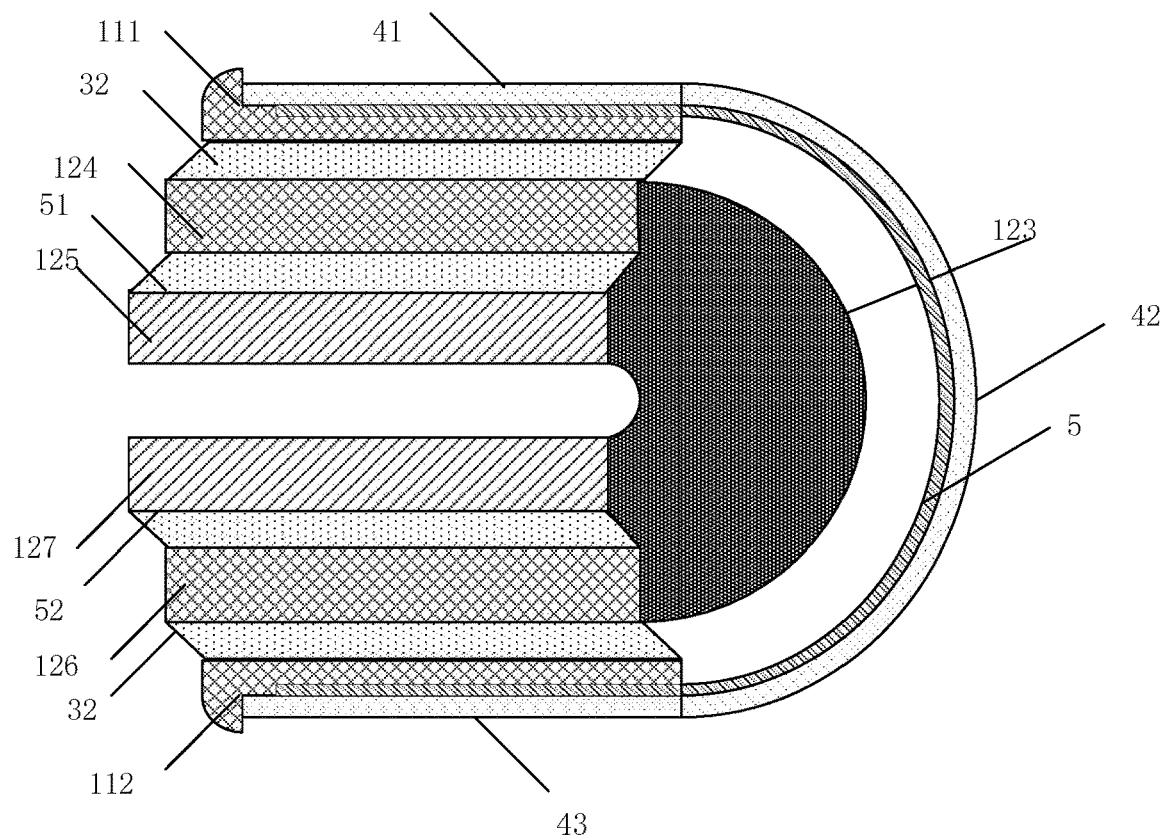
FIG. 18 is a schematic view of the display device shown in FIG. 16 when folded outward.

In some exemplary embodiments, based on the structure of the display device shown in FIG. 16, when the display device is folded outward, as shown in FIG. 18, the first bending region 42 of the flexible display module 4 and the second bending region of the support plate 5 are bent outward and the bending mechanism 123 is turned outward. Since the bending radii of the first bending region 42 and the second bending region of the support plate 5 are different, and two ends of the flexible display module 4 and two ends of the support plate 5 are fixedly connected with the first frame 111 and the second frame 112, respectively, the first deformation frame 31, the second deformation frame 32, the third deformation frame 51 and the fourth deformation frame 52 are elastically deformed, such that the dislocation movement occurs between the first frame 111 and the first middle frame 124 and between the second frame 112 and the second middle frame 126, and the dislocation movement also occurs between the first middle frame 124 and the first rear frame 125 and between the second middle frame 126 and the second rear frame 127, thereby compensating the dislocation movement between the end of the flexible display module 4 and the end of the support plate 5, reducing the squeeze between the end of the flexible display module and the edge of the housing frame, and avoiding the failure risk caused by the squeeze. Therefore, a gap at the end of the flexible display module and at the end of the edge of the housing frame is avoided as compared to the solution of reserving some space at the end of the housing frame and the end of the flexible cover plate to solve the failure risk caused by the squeeze.

In some exemplary embodiments, the first middle frame may be multiple frames, and the second middle frame may be multiple frames, and the number of the first middle frame is as same as that of the second middle frame.

In some exemplary embodiments the first middle frame may be multiple frames, and the second middle frame may be multiple frames, and the number of the first middle frame is as same as that of the second middle frame. A deformation frame is disposed between every two first middle frames, and a deformation frame is disposed between every two second middle frames. Each deformation frame includes the soft material. The soft material may use a material with a small elastic modulus, such as EPDM and/or TPEE, so as to reduce the acting force between the end of the flexible display module and the edge of the housing frame when being folded. The soft material may also use a mechanically anisotropic material such as rubber (such as asbestos rubber or silicone rubber), and on the premise of ensuring a sufficiently small tangential elastic modulus, the elastic modulus in the normal direction should not be too small to avoid affecting the sense of touch of the display device. The thickness of each deformation frame may meet the preset thickness, so as to facilitate counteracting or reducing the squeeze force between the flexible display module and the housing frame when the display device is folded inward, or to facilitate counteracting or reducing the stretching force between the flexible display module and the housing frame when the display device is folded outward. For example, the thickness of each deformation frame ranges from 200 μm to 300 μm.

In some exemplary embodiments, on the basis of the above embodiments, the bending mechanism 123 may be made of freely bendable elastomers such as rubber.

Figure 19:
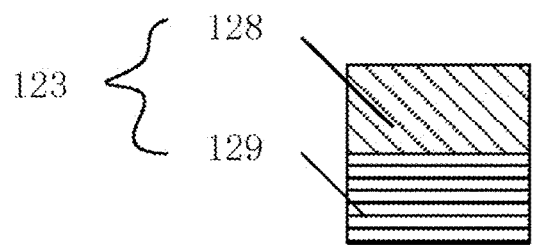
FIG. 19 is a schematic view of a structure of a bending mechanism according to an exemplary embodiment of the present disclosure.

In some exemplary embodiments, as shown in FIG. 19, the bending mechanism 123 may include a pivot hinge structure 128 and an appearance cover 129 connected with the pivot hinge structure 128. The appearance cover 129 may be made of freely bendable elastomers such as rubber.

Figure 20:
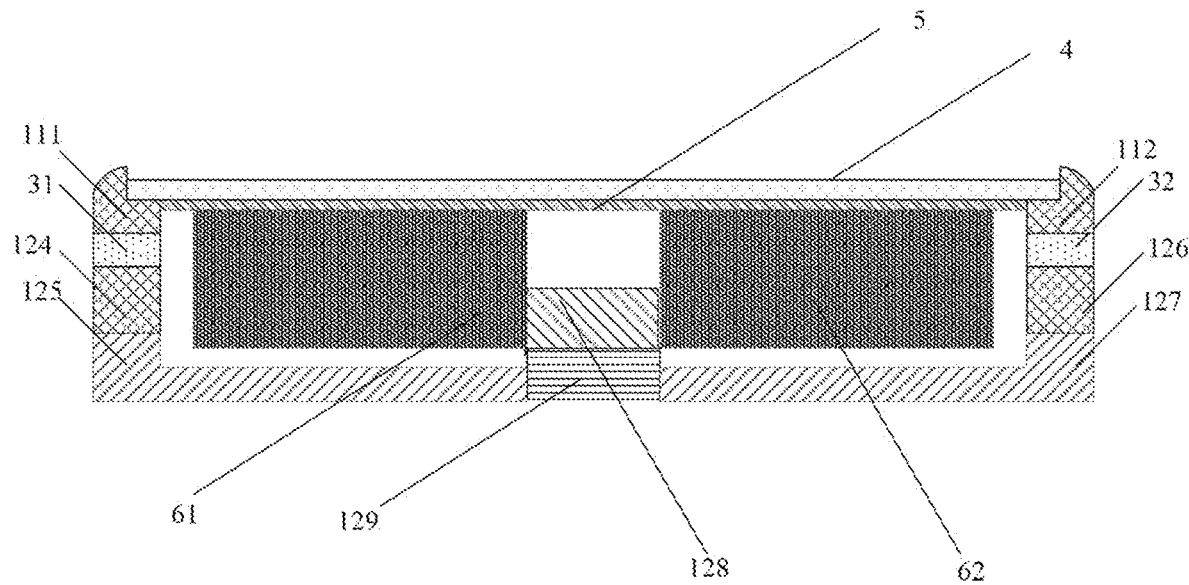
FIG. 20 is a schematic view of a structure of another display device according to an exemplary embodiment of the present disclosure.
Figure 21:
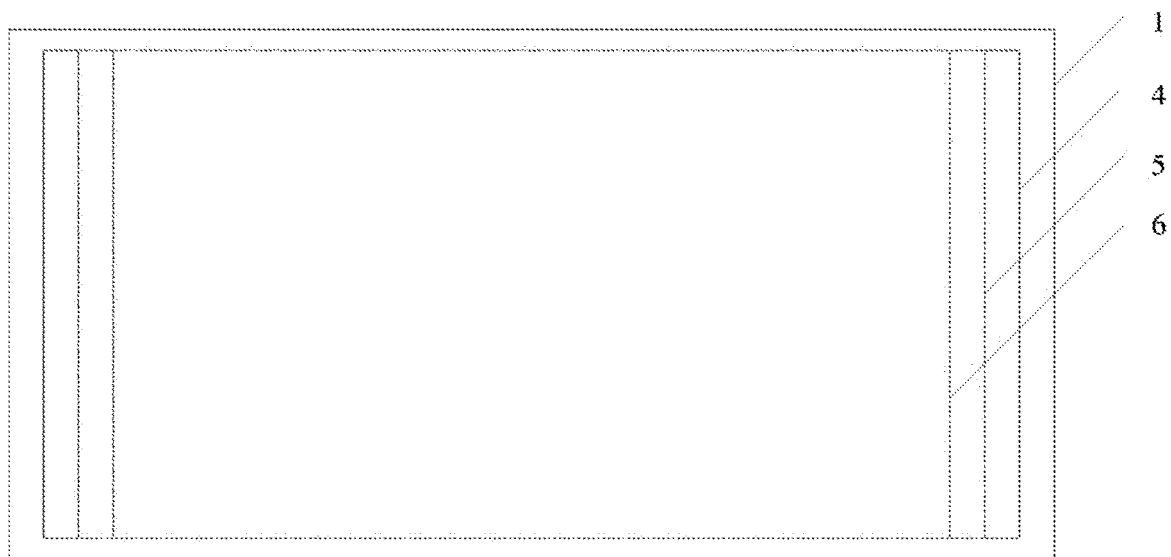
FIG. 21 is a schematic plan view of the display device shown in FIG. 20.

In some exemplary embodiments, FIG. 20 is a schematic view of a structure of another display device according to an exemplary embodiment of the present disclosure and FIG. 21 is a schematic plan view of the display device shown in FIG. 20. As shown in FIGS. 20 and 21, the bending mechanism 123 may include a rotating shaft mechanism and flip plates 6 disposed on two sides of the rotating shaft mechanism respectively on a surface parallel to the flexible display module 4.

The flip plates 6 include a first flip plate 61 disposed on a side of the first support surface away from the flexible display module and a second flip plate 62 disposed on a side of the second support surface away from the flexible display module.

In an exemplary embodiment, a side of the first flip plate 61 adjacent to the support plate 5 is fixedly connected with the first support surface. A side of the second flip plate 62 adjacent to the support plate 5 is fixedly connected with the second support surface.

In an exemplary embodiment, the rotating shaft mechanism includes the pivot hinge structure 128 and the appearance cover 129 connected with the pivot hinge structure 128. The first flip plate 61 and the second flip plate 62 are disposed on two sides of the hinge structure 128, respectively. When the first flip plate 61 or the second flip plate 62 is turned inward or outward, the flexible display module 4 and the support plate 5 are driven inward or outward, and the hinge structure 128 is driven inward or outward.

In an exemplary embodiment, the first flip plate 61 may be fixedly connected with the first rear frame, and the second flip plate 62 may be connected with the second rear frame. For example, the first rear frame includes a back plate and a frame rim, the second rear frame includes a back plate and a frame rim. The first flip plate may be fixedly connected with the frame rim of the first rear frame, and the second flip plate may be fixedly connected with the frame rim of the second rear frame, such that an exposed outer surface of the appearance cover 129 is flush with an outer surface of the back plate of the first rear frame and an outer surface of the back plate of the second rear frame.

In some exemplary embodiments, based on the display devices shown in FIGS. 4, 8, 12, and 16, the bending mechanism 123 included therein may be the structure shown in FIG. 19, or FIG. 20, or FIG. 22.

In some exemplary embodiments, the first frame, the second frame, the first deformation frame, the second deformation frame, the first bending frame, the second bending frame may be an integrated structure based on the above embodiments. For example, the first frame 111, the first deformation frame 31, and the first bending frame 121 may be an integrated structure, and collectively constitute a first frame body. The second frame 112, the second deformation frame 32 and the second bending frame 122 may be an integrated structure, and collectively constitute a second frame body. For another example, the first frame 111, the first deformation frame 31, the first middle frame 124 and the first rear frame 125 may be an integrated structure, and collectively constitute a first frame body. The second frame 112, the second deformation frame 32, the second middle frame 126 and the second rear frame 127 may be an integrated structure, and collectively constitute a second frame body. The first frame body and the second frame body may be an integrated structure.

In some exemplary embodiments, in the display devices as shown in FIGS. 3 and 4, the first frame 111 and the second frame 112 are an integrated structure, and collectively constitute a front frame of the housing frame 1, and the front frame is a rectangular hollow frame structure. The first deformation frame 31 and the second deformation frame 32 are an integrated structure, and collectively constitute a deformation frame that is a rectangular hollow frame structure. The first bending frame 121 and the second bending frame 122 are an integrated structure, and collectively constitute a rear frame of the housing frame 1, and the rear frame includes a back plate and a frame rim. The back plate is shaped as a rectangular plate and the frame rim is a rectangular hollow frame structure. The front frame, the deformable frame and the rear frame may be an integrated structure, and the front frame, the deformable frame and the rear frame collectively constitute a bottom-covered-top shell structure with an accommodating space in which the flexible display template 4, the support plate 5 and the bending mechanism 123 may all be disposed. In FIG. 4, FIG. 5, and FIG. 6, in order to facilitate understanding of the structure of the display device disclosed in the present embodiment in the unfolded state and the structure in the folded-in or folded-out state, only a part of the accommodating space, such as a blank region shown in the drawing, is shown.

In some exemplary embodiments, in the display devices as shown in FIGS. 7 and 8, the first frame 111 and the second frame 112 are an integrated structure, and collectively constitute the front frame of the housing frame 1, and the front frame is a rectangular hollow frame structure. The first deformation frame 31 and the second deformation frame 32 are an integrated structure, and collectively constitute the deformation frame that is a rectangular hollow frame structure. The first middle frame 124 and the second middle frame 126 are an integrated structure, and collectively constitute a middle frame of the housing frame 1, and the middle frame is a rectangular hollow frame structure. The first rear frame 125 and the second rear frame 127 are an integrated structure, and collectively constitute the rear frame of the housing frame 1, and the rear frame includes the back plate and the frame rim. The back plate is shaped as a rectangular plate and the frame rim is a rectangular hollow frame structure. The front frame, the deformation frame, the middle frame and the rear frame may be an integrated structure, and the front frame, the deformation frame, the middle frame and the rear frame collectively constitute the bottom-covered-top shell structure with the accommodating space in which the flexible display template 4, the support plate 5 and the bending mechanism 123 may all be disposed. In FIG. 8, FIG. 9, and FIG. 10, in order to facilitate understanding of the structure of the display device disclosed in the present embodiment in the unfolded state and the structure in the folded-in or folded-out state, only a part of the accommodating space, such as a blank region shown in the drawing, is shown.

In some exemplary embodiments, in the display device as shown in FIGS. 11 and 12, the first frame 111 and the second frame 112 are an integrated structure, and collectively constitute the front frame of the housing frame 1, and the front frame is a rectangular hollow frame structure. The first deformation frame 31 and the second deformation frame 32 are an integrated structure, and collectively constitute the deformation frame that is a rectangular hollow frame structure. The first middle frame 124 and the second middle frame 126 are an integrated structure, and collectively constitute the middle frame of the housing frame 1, and the middle frame is a rectangular hollow frame structure. The first rear frame 125 and the second rear frame 127 are an integrated structure, and collectively constitute the rear frame of the housing frame 1, and the rear frame includes the back plate and the frame rim. The back plate is shaped as a rectangular plate and the frame rim is a rectangular hollow frame structure. The front frame, the deformation frame, the middle frame and the rear frame may be an integrated structure, and the front frame, the deformation frame, the middle frame and the rear frame collectively constitute the bottom-covered-top shell structure with the accommodating space in which the flexible display template 4, the support plate 5 and the bending mechanism 123 may all be disposed. In FIG. 12, FIG. 13, and FIG. 14, in order to facilitate understanding of the structure of the display device disclosed in the present embodiment in the unfolded state and the structure in the folded-in or folded-out state, only a part of the accommodating space, such as a blank region shown in the figure, is shown. As shown in FIG. 20, other members, such as the flexible display module 4, the support plate 5, the rotating shaft mechanism 128, the appearance cover 129, the first flip plate 61, and the first flip plate 62, may be disposed in the accommodating space collectively formed by the front frame, the deformation frame, the middle frame, and the rear frame.

In some exemplary embodiments, in the display devices as shown in FIGS. 15 and 16, the first frame 111 and the second frame 112 are an integrated structure, and collectively constitute the front frame of the housing frame 1, and the front frame is a rectangular hollow frame structure. The first deformation frame 31 and the second deformation frame 32 are an integrated structure, and collectively constitute the deformation frame that is a rectangular hollow frame structure. The first middle frame 124 and the second middle frame 126 are an integrated structure, and collectively constitute the middle frame of the housing frame 1, and the middle frame is a rectangular hollow frame structure. The third deformation frame 51 and the fourth deformation frame 52 are an integrated structure, and collectively constitute another deformation frame that is a rectangular hollow frame structure. The first rear frame 125 and the second rear frame 127 are an integrated structure, and collectively constitute the rear frame of the housing frame 1, and the rear frame includes the back plate and the frame rim. The back plate is shaped as a rectangular plate and the frame rim is a rectangular hollow frame structure. The front frame, the deformation frame, the middle frame, the another deformation frame and the rear frame may be an integrated structure, and the front frame, the deformation frame, the another deformation frame, the middle frame and the rear frame collectively constitute the bottom-covered-top shell structure with the accommodating space in which the flexible display module 4, the support plate 5 and the bending mechanism 123 may all be disposed. In FIG. 16, FIG. 17, and FIG. 18, in order to facilitate understanding of the structure of the display device disclosed in the present embodiment in the unfolded state and the structure in the folded-in or folded-out state, only a part of the accommodating space, such as a blank region shown in the drawing, is shown.

In the description of embodiments of the present disclosure, unless explicitly specified and limited otherwise, the terms "connection", "fixed connection", "installation" and "assembly" should be understood broadly. For example, they may be a fixed connection, may be a detachable connection, or may be an integrated connection. The terms "installation", "connection" and "fixed connection" may be directly connected, or may be indirectly connected through an intermediate medium, or may be an internal communication between two elements. An ordinary person skilled in the art can understand the specific meanings of the above terms in the embodiments of the present disclosure according to specific contexts.

The invention claimed is:

1. A display device comprises: a flexible display module, a fixing frame and a bending frame; wherein
    the flexible display module comprises a first plane region, a second plane region and a first bending region located between the first plane region and the second plane region; the fixing frame comprises a first frame for fixing the first plane region and a second frame for fixing the second plane region;
    the bending frame comprises a first deformation frame, a first bending frame, a second deformation frame, a second bending frame, and a bending mechanism disposed between the first bending frame and the second bending frame, wherein the first bending frame is fixed with the first frame through the first deformation frame, and the second bending frame is fixed with the second frame through the second deformation frame.

2. The display device according to claim 1, wherein
    the first bending frame comprises a first rear frame connected with the first deformation frame; the second bending frame comprises a second rear frame connected with the second deformation frame; or,
    the first bending frame comprises a first middle frame connected with the first deformation frame and a first rear frame connected with the first middle frame; the second bending frame comprises a second middle frame connected with the second deformation frame and a second rear frame connected with the second middle frame.

3. The display device according to claim 2, wherein
    the first middle frame is connected with the first rear frame through a third deformation frame, and the second middle frame is connected with the second rear frame through a fourth deformation frame.

4. The display device according to claim 3, wherein
    the first deformation frame, the second deformation frame, the third deformation frame and the fourth deformation frame comprise a soft material.

5. The display device according to claim 4, wherein the soft material comprises any one or more of the following: ethylene propylene diene monomer (EPDM), thermoplastic polyester elastomer (TPEE) and rubber.

6. The display device according to claim 3, wherein thicknesses of the first deformation frame, the second deformation frame, the third deformation frame, and the fourth deformation frame range from 200 μm to 300 μm.

7. The display device according to claim 1, wherein a manner in which the first frame fixes the first plane region comprises an adhesive fixing manner, a snap-fit fixing manner or a mechanical fixing manner; and a manner in which the second frame fixes the second plane region comprises an adhesive fixing manner, a snap-fit fixing manner or a mechanical fixing manner.

8. The display device according to claim 2, wherein the fixing frame further comprises a support plate configured to support the flexible display module; and the support plate is fixedly connected with a side of the flexible display module away from a display side; and the support plate is also fixedly connected with the first frame and the second frame.

9. The display device according to claim 8, wherein the support plate comprises a first support surface, a second support surface, and a second bending region located between the first support surface and the second support surface; the first support surface is fixedly connected with a side of the first plane region away from the display side; the second support surface is fixedly connected with a side of the second plane region away from the display side; the second bending region is fixedly connected with a side of the first bending region away from the display side.

10. The display device according to claim 9, wherein the bending mechanism comprises a rotating shaft mechanism, and a first flip plate and a second flip plate located on two sides of the rotating shaft mechanism, respectively;

the first flip plate is disposed on a side of the first support surface away from the flexible display module, and the second flip plate is disposed on a side of the second support surface away from the flexible display module.

11. The display device according to claim 10, wherein a side of the first flip plate adjacent to the support plate is fixedly connected with the first support surface; and a side of the second flip plate adjacent to the support plate is fixedly connected with the second support surface.

12. The display device according to claim 10, wherein the rotating shaft mechanism comprises: a hinge structure and an appearance cover connected with the hinge structure; the first flip plate and the second flip plate are disposed on two sides of the hinge structure, respectively.

13. The display device according to claim 1, wherein thicknesses of the fixing frame and the bending frame range from 1 mm to 5 mm.

14. The display device according to claim 2, wherein a thickness of the fixing frame ranges from 1 mm to 5 mm, thicknesses of the first middle frame and the second middle frame range from 1 mm to 5 mm, and thicknesses of the first rear frame and the second rear frame range from 0.1 mm to 5 mm.

15. The display device according to claim 1, wherein the first frame, the second frame, the first deformation frame, the second deformation frame, the first bending frame and the second bending frame are an integrated structure.

* * * * *